United States Patent [19]

Inoue et al.

[11] Patent Number: 5,423,931
[45] Date of Patent: Jun. 13, 1995

[54] METHOD AND APPARATUS FOR REMOVING AN ELECTRONIC COMPONENT FROM A BOARD

[75] Inventors: Hirokazu Inoue, Toukai; Masahiro Takasaka, Hitachioota; Koichi Watanabe, Hitachi; Takashi Hosokawa, Hitachi; Mamoru Sawahata, Hitachi, all of Japan

[73] Assignee: Hitachi, Ltd., Tokyo, Japan

[21] Appl. No.: 109,067

[22] Filed: Aug. 19, 1993

[30] Foreign Application Priority Data

Aug. 26, 1992 [JP] Japan .................. 4-227015

[51] Int. Cl.⁶ .............................. B32B 35/00
[52] U.S. Cl. ...................... 156/94; 156/344; 156/584; 29/402.03; 29/762
[58] Field of Search ............ 156/94, 344, 584; 29/402.03, 762, 764; 228/191, 264

[56] References Cited

U.S. PATENT DOCUMENTS

| 4,954,453 | 9/1990 | Venutolo | 29/762 X |
| 5,157,255 | 10/1992 | Kornrumpf et al. | 250/252.1 |
| 5,269,868 | 12/1993 | Gofuku et al. | 150/344 |

FOREIGN PATENT DOCUMENTS

| 0051165 | 5/1982 | European Pat. Off. . |
| 2666451 | 3/1992 | France . |
| 3744764 | 1/1991 | Germany . |
| 61-075515 | 4/1986 | Japan . |
| 01225341 | 9/1989 | Japan . |
| 2050906 | 1/1981 | United Kingdom . |
| 9103835 | 3/1991 | WIPO . |
| 9118957 | 12/1991 | WIPO . |

OTHER PUBLICATIONS

Research Disclosure 20 Sep. 1990, Emsworth, GB pate 831 anonymous "Rework of Chips on Flexible Circuit Boards" abstr. nr. 31, 8047.

*Primary Examiner*—Mark A. Osele
*Attorney, Agent, or Firm*—Antonelli, Terry, Stout & Kraus

[57] ABSTRACT

In a method of removing a component from a wiring board to which the component is attached by heat-softenable resin, the improvement is provided of, after softening of the resin by heat and removal of the component, removing residual resin remaining on the board at the location of the component by application of ultraviolet laser radiation having an intensity sufficient to decompose and disperse said residual resin. This can be done without damaging the wiring on the board so that the wiring is re-usable to attach a further electronic component at the same location. Excessive heating of the board can be avoided by measures such as applying a pre-load to the component during softening so that it moves when sufficiently softened, and monitoring the softening.

13 Claims, 7 Drawing Sheets

U.S. Patent    June 13, 1995    5,423,931
FIG. 1
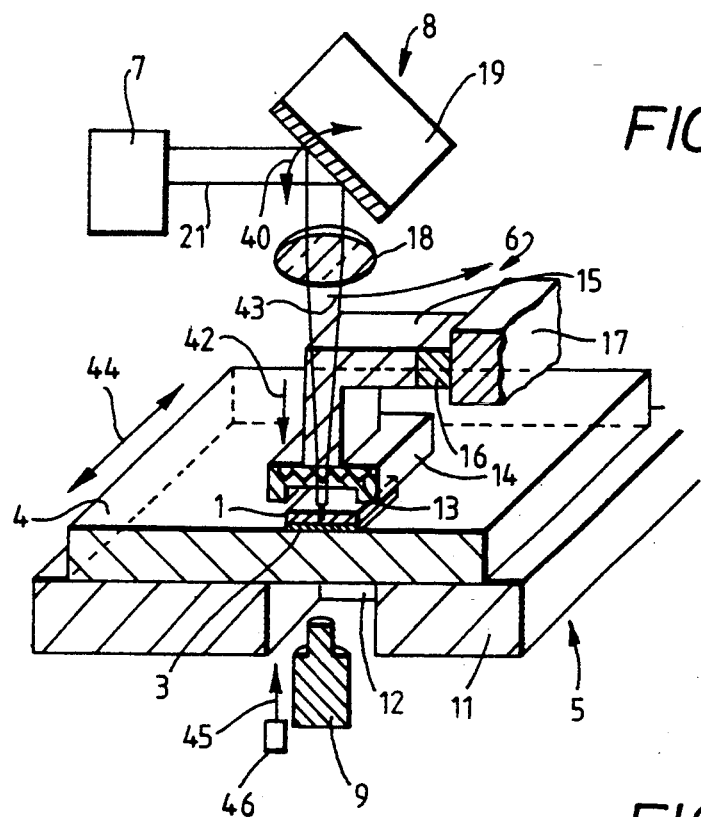
FIG. 7(a)
FIG. 7(b)
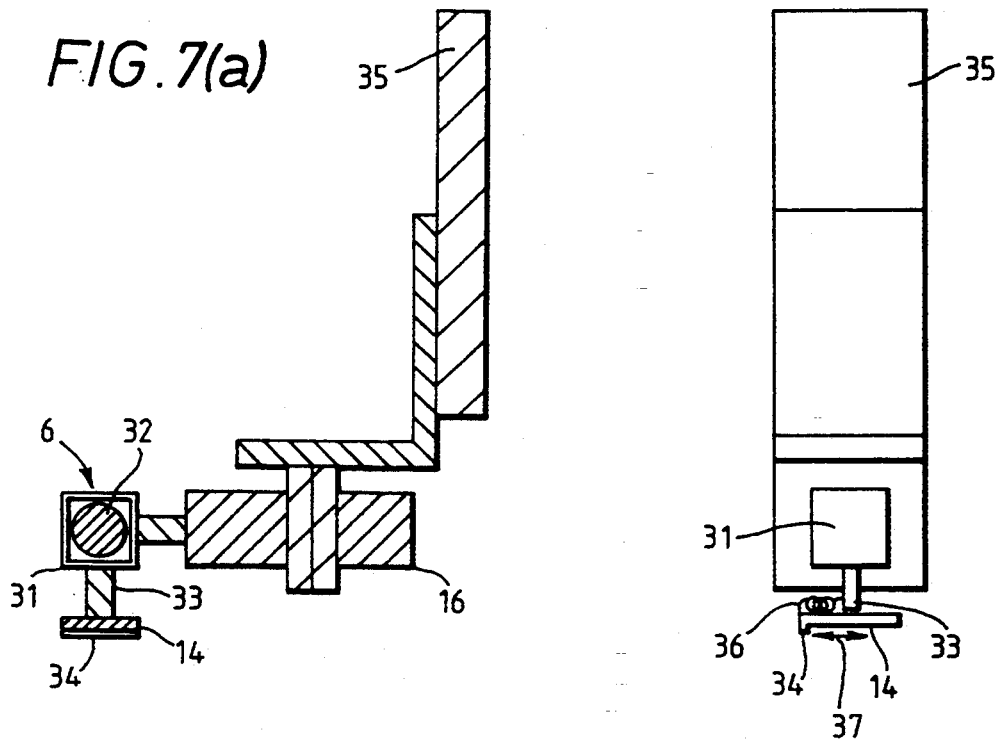

METHOD AND APPARATUS FOR REMOVING AN ELECTRONIC COMPONENT FROM A BOARD

BACKGROUND OF THE INVENTION

1. Field of the Invention

The present invention relates to a method and apparatus for removing an electronic component, such as a semiconductor device, from a board to which the component is secured with resin. The invention also relates to manufacture of electronic apparatus in which a defective component is removed from a wiring board.

2. Description of the Prior Art

In recent years, plastic material packages have been widely used with the improvement of the reliability of semiconductor devices, and semiconductor devices bonded with resin have increased with the improvement of the performance of the resin. Recently, connection structures using resin as an adhesive have increased not only in conventional die bonding, that is, bonding between the surface opposite to the circuit forming surface of a semiconductor device and a board, but in face-down bonding, that is, bonding in which the circuit forming surface of a semiconductor device faces the board.

As the resin, thermosetting, thermoplastic or ultraviolet-setting epoxy resin a is generally used. When conductivity is required, the resin is mixed with conductive particles made of metal or carbon or particles made by covering resin balls with metallic films.

When a component is found to be defective, in testing in situ on the board after bonding, it is necessary to remove that component individually, in order to avoid wastage of the whole board and other components attached to it.

When the component device is bonded by solder, it can be easily removed by melting the solder. Moreover, it is comparatively easy to return the solder state on the board almost to the original state before bonding by sucking residual solder.

However, resin bonding is not so easy to disconnect and remove as solder bonding. Especially, it is difficult to remove residual resin from the surface of a board. As a means for avoiding this, a solution is proposed in JP-A-63-157429 (1988) in which a die bonding area is constituted by two layers of resin and solder respectively, to permit bonding with the resin and removal by melting of the solder.

As a method for removing semiconductor devices with a bonding structure of only resin, JP-A-63-201627 (1988) and JP-A-2-25042 (1990) disclose techniques using the property that even thermosetting resin is softened at a high temperature. These publications describe the removal of a semiconductor device by heating and softening the resin. However, the removal of residual resin from the board, which is the biggest problem arising in component removal with bonding structures using resin, is not discussed in the prior art.

Solvent is generally used to remove residual resin. Organic acid is used as the solvent to swell the residual resin. Then the resin is wiped away by means of a cotton cleaner. However, solvent cannot be used to remove residual resin on a wiring board which is to receive another component at the same location. It takes much time to swell resin. Moreover, unless the solvent is completely removed from the board after removing the resin, corrosive matter is left in bonding areas. Thus, a problem arises that the reliability of the subsequent bonding is impaired.

There is also known a method for removing residual resin by oxidizing and decomposing the resin by heating or the like in an oxygen atmosphere. Because resin is a macromolecular compound, it easily causes oxygen deficiency and thus carbonization is difficult to avoid. As a result, not only can the resin not be removed, but also a problem occurs that the residual resin impairs the electrical insulation.

In the light of the present invention as described below, it is mentioned for completeness that ablation of resin, i.e. its removal with leaving residual products, is known in a process of etching polyimide films, e.g. in the manufacture of semiconductor devices, using UV radiation (see U.S. Pat. No. 4,508,709). Furthermore, an article in the Japanese Journal "Plasticity & Processing" Vol. 27, No. 307, page 935 is discussed below. It describes generally decomposition of thermoplastic or thermosetting resins, but not specific problems of removal.

SUMMARY OF THE INVENTION

It is an object of the present invention to provide a method and apparatus which make it possible to remove an electronic component and a resin from a board without using solvent and without carbonizing the resin, thereby enabling the board to be re-used.

A further object of the invention is to provide a method and an apparatus for removing an electronic component from a board, to which it is secured by resin, in a simple and rapid manner. It is furthermore desired to minimize the heating of the board.

According to the present invention in one aspect there is provided a method of removing an electronic component from a wiring board having wiring for the component on a surface of the board, the component being secured to said surface of the board by resin. The method includes the steps of:

(a) detaching the component from the board in a manner which leaves residual resin on the surface of the board, and (b) applying electromagnetic radiation to the residual resin, the radiation having sufficient intensity to decompose and disperse the resin.

In this aspect of the invention, it has surprisingly been found that residual resin on the surface of a wiring board can be satisfactorily removed, without leaving e.g. carbonized residue, by appropriate electromagnetic radiation and also that such a process can be performed without damaging the wiring on the surface of the board. Consequently the wiring on the board can be re-used for the attachment of a replacement component.

Preferably the above step (a) comprises at least partially softening the resin securing the component to the board and removing the component from the board while the resin is at least partially soft. Typically, the resin is capable of being softened at a temperature of not more than 350° C., and the wiring on the wiring board is resistive to a temperature of at least 350° C. The step of at least partially softening the resin is in this case performed by heating it to a temperature of not more than 350° C.

The electromagnetic radiation is preferably an ultraviolet laser beam, and the electromagnetic radiation preferably has at the surface of the board an energy density of at least 0.1 joules per pulse per $cm^2$, a peak power density of at least $10^6$ W per $cm^2$, and preferably has a wave-length of not more than 360 nm. The beam of said electromagnetic radiation may be scanned over the area where said residual resin is present.

The wiring is selected from single and multiple layer wiring, and preferably at least a surface layer of the wiring is made of a metal selected from gold, silver and aluminum.

The electronic component typically has a surface at which a circuit of the component is formed, which surface is facing either away from the surface of the board or towards the surface of the board.

One method of softening the resin is by heating the electronic component. Preferably, the removal of the component from the board is performed by movement of the component relative to the board in a path which is at least initially parallel to the surface of the board. This movement may be performed by a chuck which also effects heating of the component to soften the resin.

To provide a simple and easily operated process, and to make it possible to control the process so as to avoid excessive heating of the board, which may for example damage wiring on the board, the following methods may be employed, singly or together.

Thus, according to the invention in a further aspect, a method of removing an electronic component from a board, the component being secured to a surface of the board by resin, comprises the steps of:
(a) softening at least part of the resin, and
(b) detaching the component from the board by movement relative to the board in a path which is at least initially parallel to the surface of the board, while the resin is at least partially soft. The softening step may be performed by heating the resin so that a surface portion thereof adjacent the component is softened first. The movement relative to the board may be caused by a chuck applied to the component, the chuck moving the component in a substantially circular path.

In another method of the invention for removing an electronic component from a board, the component being secured to a surface of the board by resin, there are performed the steps of:
(a) applying a pre-load force to the component urging the component to move relatively to the board,
(b) softening the resin at least partially, and
(c) removing the component from the board after the pre-load force has caused initial movement of the component relative to the board. The pre-load force may be applied by a chuck which also heats the component to effect the softening of the resin. Preferably the pre-load force acts parallel to said surface of said board.

In yet another method according to the invention of removing an electronic component from a board, the component being secured to the board by resin, the steps of the method comprise:
(a) softening the resin by heating it,
(b) monitoring softening of the resin to determine the occurrence of a predetermined state of the resin, and
(c) removing the component from the board when the predetermined state is reached. The predetermined state is preferably monitored by one of:
(i) applying a pre-load force to the component and sensing movement of the component relative to the board, and
(ii) sensing the temperature of the resin.

The invention further provides apparatus for removing an electronic component from a wiring board having wiring for the component on a surface of the board, the component being secured to the surface of the board by resin. The apparatus comprises:
(a) means for detaching the component from the board, and
(b) means for applying electromagnetic radiation to residual resin remaining on the surface of the board after removal of the component, the radiation having sufficient intensity to decompose and disperse the resin. The detaching means preferably comprises means for heating the resin so as at least partially to soften it and means for removing said component from said board while said resin is softened.

Preferably the means for applying electromagnetic radiation comprises means for providing a beam of electromagnetic radiation and means for scanning the beam over the surface of the board. The scanning means suitably comprises means for scanning the beam in one direction and means for moving the board perpendicularly to that direction.

The apparatus may have means for detecting the softening state of the resin.

In one particular embodiment, the invention provides apparatus for removing an electronic component from a wiring board having wiring for the component on the surface of the board, the component being secured to the surface of the board by resin. The apparatus comprises:
(a) support means for the board including means for moving the board in two mutually perpendicular directions parallel to the surface of the board,
(b) a heating chuck for contacting the electronic component, thereby to heat and at least partially soften the resin, the heating chuck being adapted to remove the component from the board when the resin is at least partially softened,
(c) detecting means for sensing the softening state of the resin,
(d) means for moving the heating chuck in a movement path which is at least initially parallel to the surface of the board,
(e) means for applying an ultraviolet laser beam to the surface of the board to remove residual resin remaining on the board after the component is removed therefrom, the ultraviolet radiation having sufficient intensity to decompose and disperse the resin, and
(f) means for scanning the ultraviolet laser beam relative to the surface of the board in at least one direction.

In another particular embodiment, the invention provides apparatus for removing an electronic component from a wiring board having wiring for the component on the surface of the board, the component being secured to the surface of the board by resin, wherein the apparatus comprises:
(a) support means for the board including means for moving the board in two mutually perpendicular directions parallel to the surface of the board,
(b) a chuck for holding the electronic component to remove it from the board when the resin is at least partially softened,
(c) means for heating the resin by passing electromagnetic radiation through the board to the resin, so as at least partially to soften the resin, (d) detecting means for sensing the softening state of the resin, (e) means for moving the heating chuck in a movement path which is at least initially parallel to the surface of the board, (f) means for applying an ultraviolet laser beam to the surface of the board to remove residual resin remaining on the board after the component is removed therefrom, the ultraviolet radiation having sufficient intensity to decompose and disperse the resin, and (g) means for scanning the ultraviolet laser beam relative to the surface of the board in at least one direction.

The chuck may have at least one cutting edge for cutting wires connecting the component to the wiring on the board.

In another aspect, the invention provides apparatus for removing an electronic component from a board, the component being secured to a surface of the board by resin, the apparatus comprising:

(a) means for heating the resin at least partially to soften it, and, (b) means for detaching the component from the board by causing movement thereof relative to the board, the movement being at least initially parallel to the surface of the board.

Further the invention provides apparatus for removing an electronic component from a board, the component being secured to a surface of the board by resin, the apparatus comprising:

(a) means for applying a pre-load force to the component, the pre-load force urging the component to move relatively to the board, (b) means for heating the resin so at least partially to soften it, and (c) means for removing the component from the board after the pre-load force has caused initial movement of the component relative to the board.

Yet further, the invention provides apparatus for removing an electronic component from a board, the component being secured to the board by resin, the apparatus comprising:

(a) means for heating the resin so as at least partially to soften it, (b) means for monitoring the resin so as to determine the softening state thereof, and (c) means for removing the component from the board, when the resin has at least partly softened.

In another aspect, the invention provides apparatus for removing an electronic component from a wiring board, the component being connected to wiring on the board by wires, the apparatus comprising a chuck for holding the component during its removal from the board, the chuck having at least one cutting edge for cutting the wires.

The invention further provides a method of manufacturing an electronic apparatus comprising the steps of:

(a) securing at least one electronic component to a wiring board having wiring at its surface connected to the component in the secured position thereof, the component being secured to the board by means of heat-softenable resin, (b) testing the electronic component by means of signals applied via the wiring, (c) when the component is determined by the testing to be defective, removing the component from the board by heating the resin so as to soften it at least partially and detaching the component from the board when the resin is so softened, (d) removing residual resin remaining on the board at the location of the component by means of electromagnetic radiation having sufficient intensity to decompose and disperse the resin, and (e) securing a further electronic component to the board at the location of the removed component by means of heat-softenable resin.

As mentioned, as the resin heating means, it is possible to use both contact heat transfer heating by means of the heating chuck and non-contact heating by electromagnetic radiation. It is preferable to prevent the board temperature from rising when heating the resin from the back of the electronic component to soften the resin while by cooling the back of the board. Moreover, it is possible to more effectively remove residual resin and decrease the influence on the underlayer by checking the distribution of resin residue thickness with the monitoring mechanism and by adopting a scanning method by applying electromagnetic waves preferentially to a portion of larger film thickness.

The present invention can be applied to thermoplastic resins, thermosetting resins and light-setting resins, i.e. to all heat-softenable resins.

BRIEF DESCRIPTION OF THE DRAWINGS

Embodiments of the invention will now be described by way of non-limitative example, with reference to the accompanying drawings, in which:

FIG. 1 is a partially sectional perspective view showing a first embodiment of an apparatus of the present invention;

FIGS. 7(a) and 7(b) are front and side views respectively of a heating and component-removing mechanism embodying the present invention;

DESCRIPTION OF THE PREFERRED EMBODIMENTS

Aspects of the operation of the present invention will first be described below with respect to the following three steps.

(1) Resin Softening Step

When the entire surface of a semiconductor device is bonded with resin, the bonding strength becomes relatively large. For example, when the entire surface of a 5 mm-square semiconductor device is bonded with ordinary thermosetting epoxy resin, at least 5 kgf is required to remove the semiconductor device. Therefore, when a force of 5 kgf or more is applied to the semiconductor device, it can be removed from the bonding portion. However, because the semiconductor device is fragile, it is frequently broken. In this case, it is difficult to completely remove the pieces of broken semiconductor devices from the board. Moreover, the board may be damaged.

Figure 2:
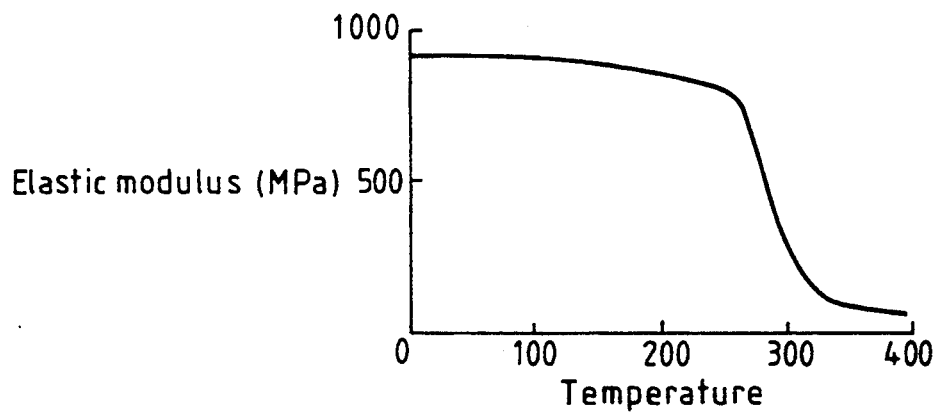
FIG. 2 is a graph showing the relationship between temperature and elastic modulus of a resin.

FIG. 2 shows a temperature-to-elasticity curve after curing thermosetting resin. It may generally be considered that cured thermosetting resin is not softened even when it is heated. However, as shown in FIG. 2, cured thermosetting resin is suddenly softened when it is heated above a certain temperature, i.e. above about 280° C. By using this characteristic, a semiconductor device can be removed.

It is thus effective to heat resin in order to soften the resin. When a single semiconductor device is mounted on a board, the resin temperature can be raised by raising the temperature of the entire board. However, it is not useful normally to adopt a heating method like this because a technique for replacing the semiconductor device is generally unnecessary in the case where a single semiconductor device is mounted on a board. That is, replacement of the board together with the semiconductor device is less expensive.

Therefore, it is desirable to keep the board temperature as low as possible so as not to exert thermal influence on adjacent semiconductor devices. To increase the resin temperature and, at the same time, minimize the temperature rise of the board, it is necessary to perform local heating. Moreover, quick heating is more effective. It is especially effective to heat a semiconductor device from the back.

Figure 4:
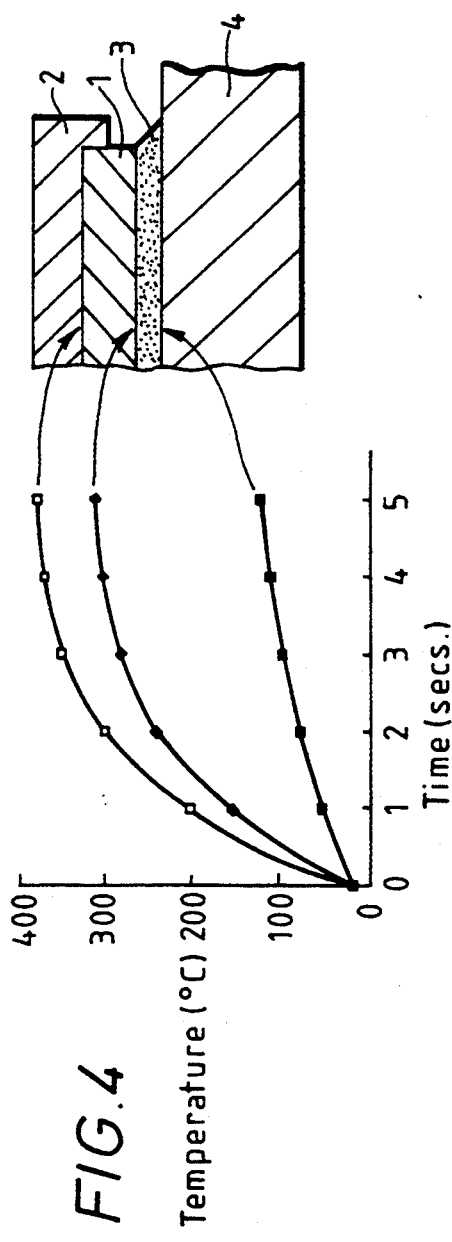
FIG. 4 is an illustration showing the temperature change of each portion of a component and a board when heated with a heating block.

FIG. 4 shows the temperature rise (before the steady state) of each of three portions of a semiconductor apparatus when heating the semiconductor device 1 from the back. The temperature of the heating block 2 is previously set to 420° C. The temperature of the back of the semiconductor device 1 contacting the heating block 2 rises up to about 400° C. within 5 seconds after the start of heating. Because the silicon constituting the semiconductor device 1 has a large thermal conductivity, the surface temperature of the semiconductor device 1 contacting the resin 3 rises to above 300° C. This temperature equals the temperature at the portion of the resin 3 contacting the semiconductor device 1. At this point of time, the portion of the resin 3 contacting the semiconductor device 1 is softened. However, because the resin 3 has low thermal conductivity, the temperature of the portion of the board 4 contacting the resin 3 rises only up to about 120°–130° C. Therefore, by heating the semiconductor device 1 from the back, the temperature of the resin 3 can be raised while keeping the temperature rise of the board small. Moreover, as shown in FIG. 4, it is also clear that the heating operation is completed before heat flow reaches the surface of the board 4, and consequently the temperature of the board 4 can be kept low by setting the temperature of the heating block 2 for heating the resin 3 to a slightly higher value and removing the semiconductor device 1 before the steady heating state is established. Furthermore, short-time heating is also effective to avoid transformation of the resin 3 due to heating, such as carbonization.

From the temperature distribution inside the resin 3, it is found that the temperature of the portion of the resin 3 contacting the board 4 rises only up to about 120°–130° C. and the resin at this region is not softened. Therefore, quick heating from the back of the semiconductor device 1 makes it possible to soften only the portion of the resin 3 contacting the semiconductor device 1. In this case, it is unnecessary to move the semiconductor device 1 obliquely upward when removing the semiconductor device 1 from the board 4. This is because the resin 3 hardly laterally expands or spreads on the board 4 when the semiconductor device 1 is removed even if the device 1 is moved parallel with the board 4.

A heating block 2, a resin softening state detection mechanism, and a semiconductor device removing chuck can be separately provided. However, the structure can be simplified by installing a mechanism for detecting the state of resin on the heating block and by removing the semiconductor device using the heating block (this mode is hereafter referred to as a heating chuck).

As heating means other than heat transfer heating from the back of a semiconductor device, it is also possible to heat the resin by infra-red radiation through the board from the back of the board, if the board is transparent or almost transparent to infra-red radiation. Moreover, it is obviously possible to use such a method together with the heating using a heating block. The heating with infra-red radiation has an advantage that it is possible to avoid an unsteady factor due to variation of the contact state in heat transfer heating, that is to avoid the drawback that temperature rise depends on the contact condition. It is also possible to selectively heat resin or the silicon with radio waves by using the principle of a microwave oven.

The following is the description of the detection means for detecting the softening state of the resin. As one means for measuring the softening state of the resin there is used direct detection of the softening state, using a load detector such as a load cell. The load detector can be mounted on the heating block, a board holding base or a semiconductor device removing chuck. As means for indirectly measuring the softening state of the resin, it is possible to use means for measuring the resin temperature such as a thermocouple, thermistor or infra-red thermometer. The thermocouple or infra-red thermometer can be mounted on the heating block or a semiconductor device removing chuck. The infra-red thermometer can be arranged at the back of a board if the board is transparent to the wavelength. As a simpler method, the time until the resin is softened is previously measured with a timer, to decide the timing at which the semiconductor device is removed, but this does not employ detection means.

(2) Electronic Component Removing Step

Figure 3A:
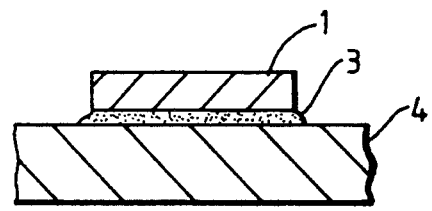
FIGS. 3(a) to 3(c) are sectional views illustrating the resin-softening and electronic component-removing steps of the present invention.
Figure 3B:
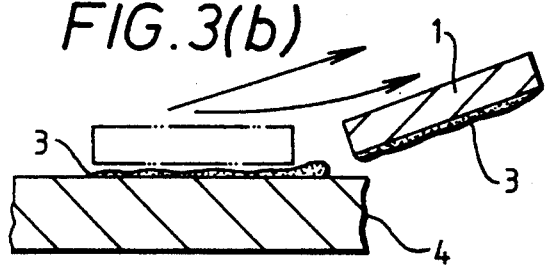

When resin is softened, the semiconductor device shows the same behaviour as an article attached to another object by liquid. That is, the semiconductor device easily moves parallel to the board surface but it is difficult to remove the semiconductor device directly from the board. Therefore, when first a rightward force in parallel with the board 4 is applied to the semiconductor device 1 in the state shown in FIG. 3(a) and then an oblique lifting force is applied to it as shown in FIG. 3(b), the semiconductor device 1 is easily separated from the board 4. In this case, it is better to minimize the distance by which the semiconductor device 1 is moved parallel to the board 4. This is because the resin 3 is pulled by the semiconductor device 1 and it might spread to an undesired extent.

However, when a temperature gradient is caused to exist in the resin 3 and a heating condition is selected under which only the portion of the resin 3 on the side towards the semiconductor device 1 is softened, the semiconductor device 1 can be removed from the board 4 only by moving the semiconductor device 1 in parallel with the board 4.

(3) Residual Resin Removing Step

Figure 3C:
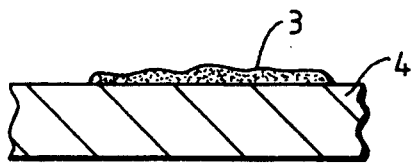

After the semiconductor device 1 is removed, the resin 3 serving as an adhesive is left as shown in FIG. 3(c). Though it is unnecessary to remove the residual resin 3 from the semiconductor device 1, it is necessary to remove the residual resin 3 from the board 4.

As described in "Plasticity and Processing", Vol. 27, No. 307, p.935, resin can be decomposed by applying to it energy larger than the bond energy between the atoms constituting the resin. For example, the bond energy of the single bond between carbon atoms is 80 kcal/mol.K which corresponds to about 360 nm in wavelength. When electromagnetic radiation shorter than the above wavelength is applied to the resin, the bond between the carbon atoms can be dissociated if the electromagnetic radiation has a certain intensity or more. Similarly, when electromagnetic radiation having an energy higher than the bond energies between carbon and hydrogen atoms, and hydrogen and nitrogen atoms (i.e. electromagnetic radiation having shorter wavelengths) are applied to the resin, each bond can be dissociated. As a result, the resin is instantaneously decomposed and dispersed. This phenomenon is called ablation. By this method, no resin residue is left, or no undesired processes such as carbonization occur. For example, the electromagnetic wave intensity density per pulse typically should be 0.1 J/cm$^2$ or more and the peak power 1,000,000 W/cm$^2$ or more. To realize these values, it is preferable to use an ultraviolet laser beam.

Ultraviolet radiation is preferably used in removal of resin residue, in order to dissociate the bond between carbon atoms or the like constituting the resin. By this method, practically no resin is left after it is decomposed. However, there is a risk that the wiring on a board may be damaged. In general, such wirings are transparent wiring made of inorganic oxide known as ITO (composite oxide of indium and tin) or metallic wiring made of aluminum, gold or silver. These wirings are not decomposed by ultraviolet radiation but they are sublimated by a slight heat of the ultraviolet radiation.

Figure 5:
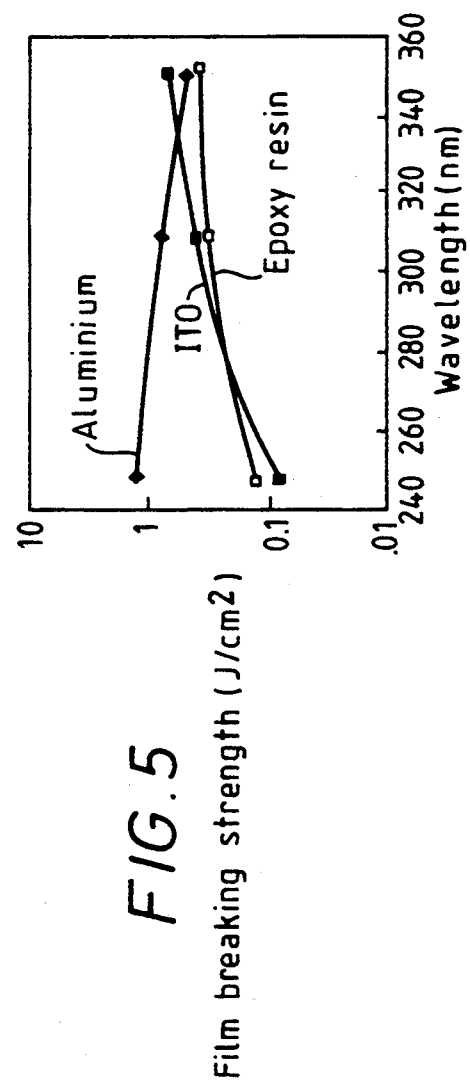
FIG. 5 is an illustration showing the relationship between wavelength of electromagnetic radiation and breaking strengths of wire and resin film.

The inorganic oxide film (e.g. ITO) is more easily sublimated because the absorption coefficient increases when the wavelength of ultraviolet radiation gets shorter. Therefore, a laser beam with a long wavelength (e.g. xenon fluorine (XeF) laser beam (wavelength: 351 nm)) is suitable for practical use. When a metallic film made of aluminum, gold or silver is used for the wiring, a laser beam with a short wavelength is suitable because the energy conversion rate from light into heat increases as the wavelength gets longer though the absorption coefficient does not have wavelength dependency. For example, a krypton fluorine (KrF) laser beam (wavelength: 248 nm) is suitable for practical use. FIG. 5 shows the relationship between the wavelength of ultraviolet radiation applied and the threshold value of breaking strength of resin and wiring materials. In FIG. 5, the wavelength dependency of each material appears plainly.

The intensity of an ultraviolet laser beam is non-uniform in an area to which the beam is applied. Therefore, it is preferable to perform pulsed multiple beam application in which the beam applying position is slightly shifted for each pulse. Moreover, multiple beam application is effective to use the difference of influence of the laser beam intensity on the resin and the wiring materials. That is, if the resin has a certain strength or more, only the thickness to which the resin is ablated is decreased even if the laser beam intensity decreases. However, metallic films and ITO do not have intensity dependencies, as the resin does. It is possible to increase the range of the laser beam intensity in which only the resin can be removed by properly adjusting the intensity and the rate of application of the laser beam.

As described above, however, the appearance of the metallic film in the beam applying position changes because an ultraviolet laser beam has a heating effect. For example, the surface luster of aluminum film increases because the oxide film on the surface is removed and the surface irregularity is somewhat decreased due to heat. The surface color of a multilayer formed by depositing Gold on nickel fades slightly due to mutual diffusion of Gold and nickel. In any case, however, the performance of wiring materials, including the reliability, does not change.

Aluminium film is especially resistant against an ultraviolet laser beam. One reason is that the aluminum film has a high reflectance in the ultraviolet region and another reason is that locally generated heat due to the laser beam is quickly dispersed around because the aluminum film has a high thermal conductivity. Therefore, it is preferable to use aluminum as a surface wiring material of a board, when the operation of removing a semiconductor device bonded by resin can be expected to be employed.

The area irradiated with one laser pulse is generally smaller than the area where resin must be removed. Therefore, it is frequently necessary to relatively move the position of application of the electromagnetic radiation so that electromagnetic radiation covers the entire area where resin is to be removed. This is done, for example, by scanning the area with a laser. In this case, it is possible to continuously move the board and/or the optical system. The reason is that the boundary of the beam location is sharp even if the beam is applied while the board or optical system moves, because the laser pulse is very short (e.g. several nanoseconds to several tens of nanoseconds).

To scan an object with a laser beam by moving a laser optical system such as by the rotation of a mirror, the optical path length changes during scanning. Though it is possible to correct the shift of the focal point, no serious problem is caused even if the focal point deviation is not corrected.

The thickness of residual resin film is not uniform. Moreover, it is possible to remove resin by pulses up to several hundred in number, merely by adjusting the overall laser beam intensity. Therefore, a board and wirings on the board can be protected and useless laser beam application can be avoided by monitoring the resin film thickness and preferentially applying the laser beam to thicker portions.

Figure 6:
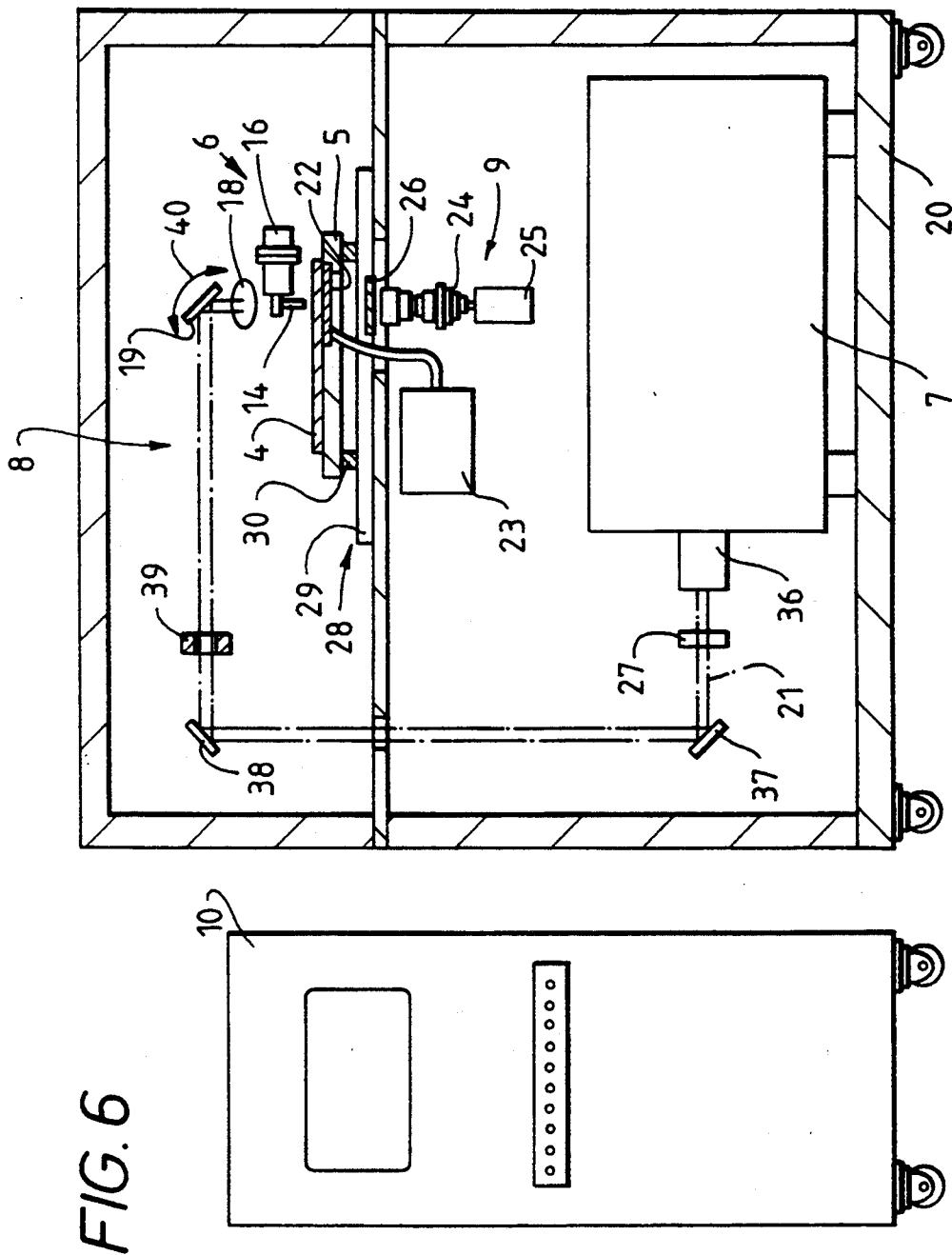
FIG. 6 is a partially sectional front view showing another embodiment of an apparatus of the present invention.

An embodiment of the present invention will be described below, referring to FIGS. 1, 6, 7 and 8. FIG. 6 and FIGS. 7(a) and 7(b) show modifications of the construction of the general heating and removing mechanism 6 of FIG. 1, but the same general principles apply to both.

This embodiment of FIG. 1 is an apparatus for removing a semiconductor device, which comprises a sample holding base 5 for holding an object to be processed, a heating and removing mechanism 6 for heating and softening resin to permit removal of a semiconductor device 1 from a board 4, an ultraviolet laser beam source 7, an optical system 8 for directing the ultraviolet beam emitted from the ultraviolet laser beam source 7 to the resin 3, a monitoring mechanism 9 for monitoring the softening state of the resin 3, and a sequence control means 10 (see FIG. 6) for controlling the operation of each of the above components. FIG. 6 shows the parts included in FIG. 1 in a typical layout in a casing 20, with the separate control means 10.

The sample holding base 5 has a sample holding section 11 and a monitoring hole 12. The heating and removing mechanism 6 comprises a heating chuck 14 containing an embedded heater 13 and having heating and removing functions, an arm 15 supporting the heating chuck 14, a load cell 16 for measuring the lateral force applied to the heating chuck 14, and a mounting head 17 coupled to a mechanism (not illustrated) for moving the heating chuck 14. The optical system 8 is not completely shown in FIG. 1. Only a lens 18 at the final stage and a mirror 19 are shown, but other parts required are conventional and will be clear to an expert. Because the focal length of the lens 18 is 100 mm, the heating and removing mechanism 6 can be set between the lens 18 and semiconductor device 1. A plurality of the semiconductor devices are actually mounted on the board 4, but FIG. 1 shows only one semiconductor device 1 which is to be removed.

Referring to FIG. 6, in which the apparatus is shown partly in section, the laser beam source 7 (the interior is omitted) is provided at the bottom of the casing 20. The sample holding base 5, heating and removing mechanism 6, and monitoring mechanism 9 are arranged above the laser beam source 7. A laser beam 21 is directed from the laser beam source 7 to the sample holding base 5 by the optical system 8. Each component will be described below in more detail.

The sample holding base 5 is a base on which the board 4 having the semiconductor device 1 is held by a conventional vacuum chuck (not illustrated). It is possible to observe the region of the device 1 by means of a television camera 25 with a magnifying lens 24 while illuminating it from below the board 4 by an illuminating system 23 because the board 4 is transparent and a part of the sample holding base 5 is made of a quartz plate 22. A shutter 26 is so provided that the laser beam 21 does not directly strike the magnifying lens 24 and the television camera 25. The camera interlocks with a shutter 27 of the laser optical system so that only one of the shutters 26, 27 opens at any one time.

The sample holding base moving mechanism 28 moves the sample holding base 5 so that the semiconductor device 1 to be removed is brought to the operating position. The mechanism is constructed in that an X-direction moving mechanism 29 effecting movement in the X direction is mounted on a Y-direction moving mechanism 30 effecting movement in the Y direction. Stepping motors are used for the movements. This mechanism is also used to scan the board 4 with a laser beam.

The heating and removing mechanism 6 shown in FIGS. 7(a) and 7(b) has a chuck contact adjusting mechanism 31 for absorbing a slight difference between angles of the heating chuck 14 and the semiconductor device 1, to ensure good contact of the heating chuck 14 and the device 1. The heater 13 (FIG. 1) is a ceramic heater with a capacity to achieve 400° C. The mechanism 31 contains a metal ball 32 to automatically adjust the angle of the heating chuck 14. The heating chuck 14 and a chuck support 33 supporting the chuck are able to slide relatively in the left-right direction 37 of FIG. 7(b). A spring 36 (FIG. 7(b)) is provided between the heating chuck 14 and the chuck support 33 to enable the chuck 14 to pull the device 1 at a predetermined tension. When a semiconductor device 1 is in contact with the heating chuck 14, the entire heating and removing mechanism 6 moves so that a downward projection 34 at the end of the heating chuck 14 engages and pulls the device 1 parallel to the surface of the board 4. The load cell 16 monitors the tension. Reference numeral 35 indicates a mounting head, attaching the mechanism 6 to the means for moving it (not shown). The chuck 14 contains a vacuum-chucking passage (not shown) to grip a device 1 by suction, in order to lift it from the board 4 as described below.

In the optical system 8 ultraviolet radiation having a wavelength of 248 nm emitted through a laser beam emitting hole 36 of the excimer laser beam source 7 is directed to the top of the apparatus by mirrors 37 and 38 (FIG. 6). Then, peripheral portions of the ultraviolet laser beam, having intensity irregularity, are removed by an aperture 39 and the beam is focused on the residual resin 3 on the surface of the board 4, by the lens 18. The mirror 19 is installed immediately before the final-stage lens 18 to reflect the laser beam 21 from parallel with the board surface to perpendicular to the board surface. The mirror 19 is also used for scanning the board surface with the laser beam 21 by rotating it in the direction shown by an arrow 40 in FIG. 6. The energy density of the laser beam 21 may be increased up to about 20 times by a lens group (not illustrated).

The sequence control means 10 controls the series of operations. In particular, it controls the operations of the heating and removing mechanism 6, the sample holding base 5, and the optical system 8 as required.

FIG. 8 shows sectional views showing the steps of the method of removal of semiconductor device 1 performed by the above described apparatus of the present invention. In this case, conductive resin 3 is present only at the ends of bumps 41 provided on the semiconductor device 1.

Figure 8A:
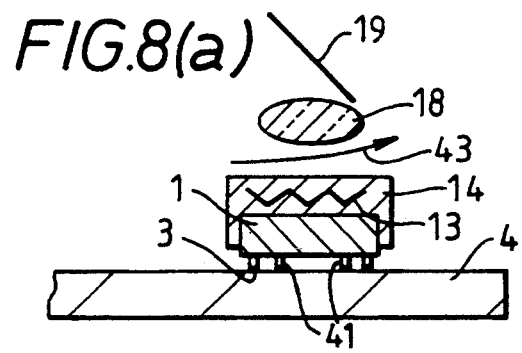
FIGS. 8(a) to 8(c) are sectional views showing the steps of the removing method performed in an embodiment of the present invention.

As shown in FIG. 8(a), the heating chuck 14 heated by the heater 13 is moved in the direction 42 to make contact with the semiconductor device 1. At the same time, a force is applied in the removing direction 43. In this case, the sequence control 10 adjusts a driving circuit (not illustrated) of the heating and removing mechanism 6 so as to maintain a load at 30 gf on the device 1 by using the load cell 16. A vacuum-chucking passage (not illustrated) in the heating chuck 14 opens to effect gripping of the semiconductor device 1. Heating of the device 1 and the resin 3 thus takes place.

Figure 8B:
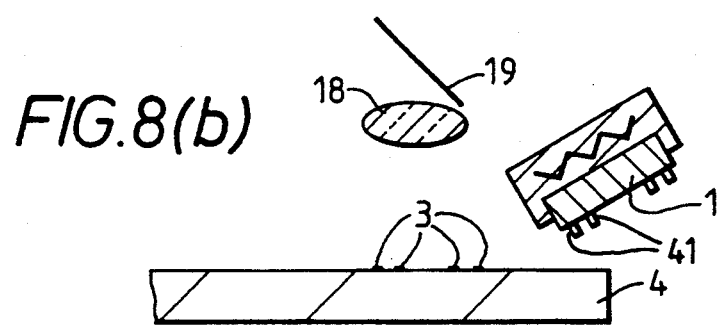

Then, as shown in FIG. 8(b), when the resin 3 is softened, the output of the load cell 16 suddenly decreases from the set load. The sequence control 10 detects the signal of the sudden decrease of the load cell output and immediately moves the heating and removing mechanism 6 a large distance in the removing direction 43. In this case, rotational movement is given to the heating chuck 14 so that the semiconductor device 1 is easily removed. The initial direction is parallel to the surface of the board 4. In this embodiment, it takes about 3 sec until the removal of the semiconductor device 1, after the heating chuck 14 contacts with the semiconductor device 1.

Figure 8C:
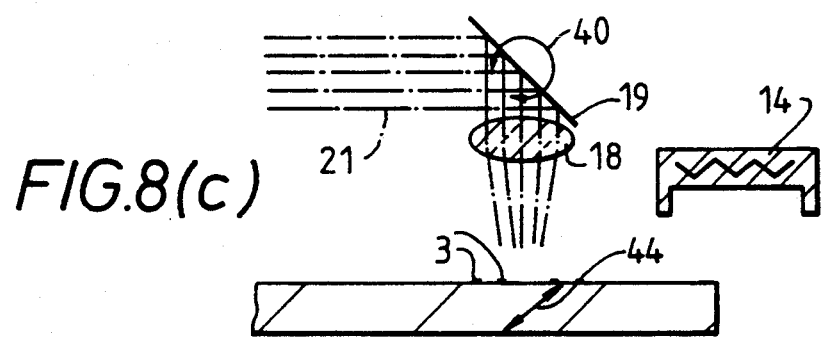

Then, as shown in FIG. 8(c), the laser beam 21 is applied to the resin 3. In this case, the laser beam 21 has a wavelength of 248 nm and an energy density of 0.3 J/cm$^2$ on the board surface. Because the spot size is 2×2 mm, the board 4 and the laser beam 21 are moved to irradiate the entire surface of the semiconductor device 1 (4×8 mm), the mirror rotational direction 40 being perpendicular to the board moving direction 44. In this example, it experimentally took about 2 sec to remove the resin residue 3 completely from the board 4 by decomposing and dispersing it.

In a variation of the embodiment described, the chuck 14 is not heated. Instead energy to soften the resin 3 is applied by electromagnetic radiation, e.g. infra-red radiation, which passes through the board 4 in the direction of the arrow 45 in FIG. 1 from an infra-red source 46, e.g. an infra-red laser.

In the above embodiment, removal of the semiconductor device 1 from the board 4 and removal of the residual resin 3 from the board 4 are performed in the same position. However, it is possible to perform the operations in separate positions. Moreover, a construction is possible in which the optical system 8 is moved back to a stand-by position during the heating and removing step instead of moving the heating and removing mechanism 6 from the position above the board 4 during the laser beam application. In FIG. 6, the laser beam source 7 is shown installed at the bottom of the apparatus in order to effectively use the floor area. However, it is also possible to install the laser beam source 7 in a different place. In this case, maintenance of the laser beam source 7 can be easily carried out. Though the heating and removing mechanism 6 is integrated, it is possible to provide a heating mechanism and a removing mechanism separately.

Methods of scanning the laser beam position, different from the method moving both the mirror 19 and board 4 as shown in this embodiment, are possible. It is possible to adopt a scanning method using two mirrors perpendicular to each other or a scanning method in which the board is moved in two directions perpendicular to each other and parallel with the board surface. The illustrated embodiment uses a structure for scanning both the mirror and the board, to achieve high scanning speed and simplification of the entire apparatus. Scanning is performed with a laser beam because the area irradiated with the laser beam is small. However, it may be possible to adjust the irradiated area to the dimensions of the semiconductor device to irradiate the whole area with a laser beam at one time. In this case, the apparatus construction is the same as that of the above embodiment, except that the focal length of the lens of the optical system and the dimension of the beam aperture are changed.

Figure 9:
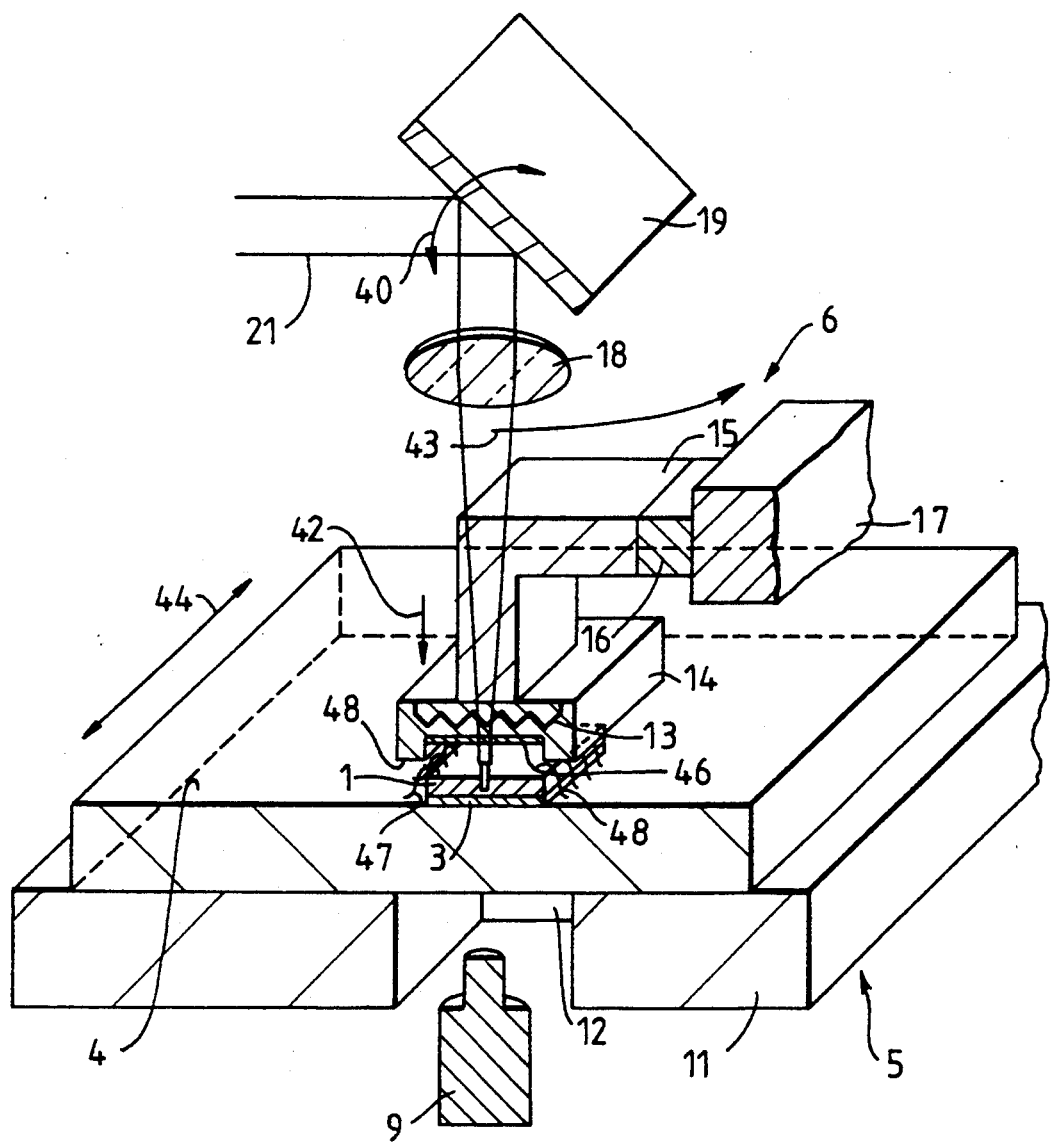
FIG. 9 is a partially sectional perspective view showing yet another embodiment of an apparatus of the present invention.

Another embodiment of the present invention will be described below, referring to FIGS. 9 and 10. FIG. 9 is a partially sectional perspective view of the embodiment of the invention. Parts similar to those of FIG. 1 will not be described in detail again.

In this embodiment, the semiconductor device removing apparatus comprises a sample holding base 5, a heating and removing mechanism 6, an optical system 8, a monitoring mechanism 9 and a sequence control (not illustrated). The sample holding base 5 has a sample holding section 11 and monitoring hole 12. The heating and removing mechanism 6 comprises a heating chuck 14 with a heater 13, an arm 15 supporting the heating chuck 14, a mounting head 17 connected to a moving mechanism (not illustrated) for the heating chuck 14, a temperature detecting plate 46 provided in the heating chuck 14, and a wire cutting section 48 for cutting wires 47 of a semiconductor device 1. The chuck 14 has a thin plate 46 at its face, containing a thermocouple in a small hole (not shown) for detecting temperature.

The circuit-forming surface of the semiconductor device 1, unlike the first embodiment, does not face the board 4. That is, a bonding structure is used in which the surface opposite to the circuit-forming surface of the semiconductor device 1 is bonded to the board 4 with resin 3. The semiconductor device 1 is electrically connected to the board 4 by thin gold wires 47.

FIG. 10 shows sectional views of the steps of the methods of removing a semiconductor device 1 performed by this embodiment of the present invention.

Figure 10A:
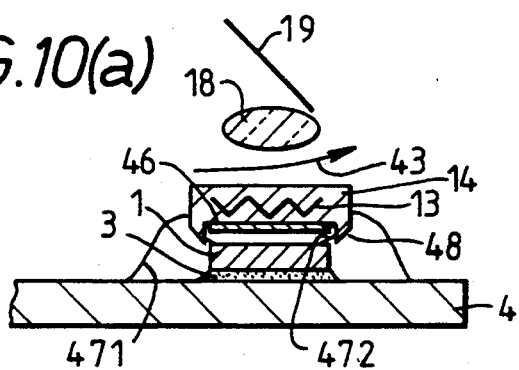
FIGS. 10(a) to 10(c) are sectional views showing the steps of the removing method performed in another embodiment of the present invention.

As shown in FIG. 10(a), the heating chuck 14 heated by the heater 13 is moved in the direction towards the semiconductor device 1 so as to make contact with the semiconductor device 1. At this time, as shown in FIG. 10(a), the wire cutting section 48 cuts the wires 47. As a result, the wires 47 are cut into cut wires 471 on the board 4 and cut wires 472 on the semiconductor device 1. Because the wires are thin (diameter: 20 μm), no trouble occurs even if the cut wires 472 are left on the semiconductor device 1. The heating chuck 14 is further lowered, leaving the cut wires 472 of the semiconductor device 1, so as to transfer heat to the semiconductor device 1. The temperature detecting mechanism of the thermocouple (not shown) in the plate 46 detects the temperature of the semiconductor device 1. When the temperature of the surface of the semiconductor device 1 reaches 300° C. which is the softening temperature of the resin 3, the sequence control (not illustrated) outputs an instruction to the driving circuit for the heating and removing mechanism 6 to apply a force in the removing direction 43.

Figure 10B:
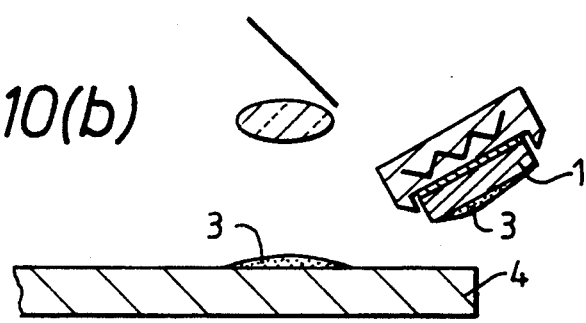

As shown in FIG. 10(b), the heating and removing mechanism 6 moves in the removing direction 43 when the resin 3 is softened. The rotational movement given to the heating chuck 14 easily removes the semiconductor device 1. The resin residue 3 on the semiconductor device 1 is left on the back of the semiconductor device 1 (non-circuit-forming surface of the semiconductor device 1). Resin residue is also left on the board 4.

Figure 10C:
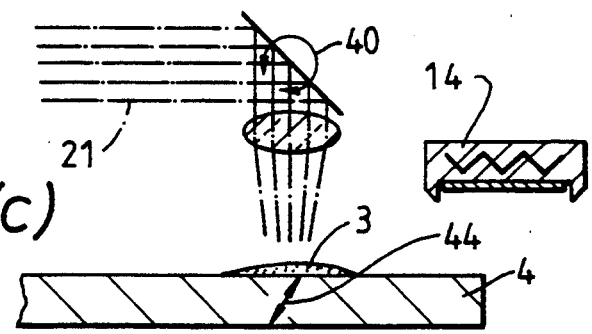

As shown in FIG. 10(c), the laser beam 21 is now applied to the resin residue 3 on the board 4. Because no wiring pattern is present at the bonding portion on the board 4 in this embodiment, the laser beam wavelength can for example be any one of 351, 308 and 248 nm. In this embodiment, the laser beam wavelength is 351 nm. The energy density on the beam applying surface is 0.5 J/cm$^2$. Because the spot size is 2 mm×2 mm, scanning is performed by rotating the mirror in a direction 40 perpendicular to the board movement direction 44 in order to irradiate the entire surface of the semiconductor device 1 (4 mm×8 mm).

The present invention thus makes it possible to avoid a problem arising due to solvent residue left after removing resin with a solvent. By the method the resin can be completely removed from a board without carbonizing the resin because the resin securing electronic components to the board is decomposed and dispersed by electromagnetic radiation.

What is claimed is:

1. A method of removing an electronic component from a wiring board having wiring for said component on a surface of the board, said component being secured to said surface of the board by resin, comprising the steps of:

(a) detaching said component from said board in a manner which leaves residual resin on said surface, and
   (b) applying ultraviolet beam radiation to said residual resin, said radiation having sufficient intensity to decompose and disperse the resin, and wherein said ultraviolet beam radiation has at said surface of said board an energy density of at least 0.1 to 1 joules per pulse per cm$^2$, a peak power density of at least $10^6$ W per cm$^2$, and a wavelength of not more than 350 nm, wherein step (a) comprises a step of at least partially softening said resin securing said component to said board and a step of removing said component from said board while said resin is at least partially soft, and further including the step of monitoring the softening of the resin to determine the occurrence of a predetermined state of softening of the resin, and said step of removing said component from said board is performed when said predetermined state is detected by said monitoring.

2. A method of removing an electronic component from a wiring board having wiring for said component on a surface of the board, said component being secured to said surface of the board by resin, comprising the steps of:

(a) detaching said component from said board in a manner which leaves residual resin on said surface, and
   (b) applying ultraviolet beam radiation to said residual resin, said radiation having sufficient intensity to decompose and disperse the resin, and wherein said ultraviolet beam radiation has at said surface of said board an energy density of at least 0.1 to 1 joules per pulse per cm$^2$, a peak power density of at least $10^6$ W per cm$^2$, and a wavelength of not more than 360 nm, wherein said step (a) comprises a step of at least partially softening said resin securing said component to said board and a step of removing said component from said board while said resin is at least partially soft, and further including the step of monitoring the softening of the resin to determine the occurrence of a predetermined state of softening of the resin, and said step of removing said component from said board is performed when said predetermined state is detected by said monitoring, and wherein said predetermined state is monitored by applying a pre-load force to said component and sensing movement of said component relative to said board under said pre-load force.

3. A method of removing an electronic component from a board, said component being secured to a surface of the board by resin, comprising the steps of:

(a) applying a pre-load force to said component urging said component to move relatively to said board, whereby softening of said resin is monitored to determine the occurrence of a predetermined state of softening of said resin,
   (b) softening said resin at least partially,
   (c) detecting the occurrence of said predetermined state of softening of said resin, and
   (d) removing said component from said board in response to said detecting after said pre-load force has caused initial movement of said component relative to said board.

4. A method according to claim 3, comprising applying said pre-load force by a chuck which also heats said component to effect said softening of said resin.

5. A method according to claim 3, wherein said pre-load force acts parallel to said surface of said board.

6. A method of removing an electronic component from a board, said component being secured to the board by resin, comprising the steps of:

(a) softening the resin by heating it,
   (b) monitoring softening of the resin to determine the occurrence of a predetermined state of softening of the resin,
   (c) detecting the occurrence of said predetermined state of softening of said resin, and
   (d) removing said component from said board in response to said detecting when said predetermined state is reached, and wherein said predetermined state is monitored by applying a pre-load force to said component and sensing movement of said component relative to said board.

7. Apparatus for removing an electronic component from a wiring board having wiring for said component on the surface of the board, said component being secured to said surface of the board by resin, said apparatus comprising:

(a) support means for said board including means for moving said board in two mutually perpendicular directions parallel to said surface of said board,
   (b) a heating chuck for contacting said electronic component, thereby to heat and at least partially soften said resin, said heating chuck being adapted to remove said component from said board when said resin is at least partially softened,
   (c) detecting means for sensing the softening state of said resin,
   (d) means for moving said heating chuck in a movement path which is at least initially parallel to said surface of said board,
   (e) means for applying an ultraviolet laser beam to said surface of said board to remove residual resin remaining on said board after said component is removed therefrom, said ultraviolet radiation having sufficient intensity to decompose and disperse said resin,
   (f) means for scanning said ultraviolet laser beam relative to said surface of said board in at least one direction, and wherein said heating chuck has at least one cutting edge for cutting wires connecting said component to said wiring on said board.

8. Apparatus for removing an electronic component from a wiring board having wiring for said component on the surface of the board, said component being secured to said surface of the board by resin, said apparatus comprising:

(a) support means for said board including means for moving said board in two mutually perpendicular directions parallel to said surface of said board, (b) a chuck for holding said electronic component to remove it from said board when said resin is at least partially softened, (c) means for heating said resin by passing electromagnetic radiation through said board to said resin, so as at least partially to soften said resin, (d) detecting means for sensing the softening state of said resin, (e) means for moving said heating chuck in a movement path which is at least initially parallel to said surface of said board, (f) means for applying an ultraviolet laser beam to said surface of said board to remove residual resin remaining on said board after said component is removed therefrom, said ultraviolet radiation having sufficient intensity to decompose and disperse said resin, (g) means for scanning said ultraviolet laser beam across said surface of said board in at least one direction, and wherein said chuck has at least one cutting edge for cutting wires connecting said component to said wiring on said board.

9. Apparatus for removing an electronic component from a board, said component being secured to a surface of said board by resin, said apparatus comprising:

(a) means for heating said resin at least partially to soften it, (b) means for detaching said component from said board by causing movement thereof relative to said board, said movement being at least initially parallel to said surface of said board, wherein said detaching means comprises a chuck engageable with said component and means for causing said chuck to apply a pre-load force urging said component in a direction parallel to said surface of said board, so that said pre-load force causes initial movement of said component relative to said board upon softening of said resin, thereby to monitor softening of said resin, and means for detecting when said initial movement of said component occurs and for effecting said detaching of said component from said board in response to said detection of said initial movement, and wherein said detaching means further includes means for heating said chuck so that said chuck heats said electronic component, thereby to soften said resin.

10. Apparatus for removing an electronic component from a board, said component being secured to a surface of said board by resin, said apparatus comprising:

(a) means for applying a pre-load force to said component, thereby to monitor softening of said resin, said pre-load force urging said component to move relatively to said board, (b) means for heating said resin so at least partially to soften it, (c) means for detecting the occurrence of said softening which results in relative movement between said component and said board, and (d) means for removing said component from said board in response to said detection by said means for detecting after said pre-load force has caused initial movement of said component relative to said board.

11. Apparatus for removing an electronic component from a board, said component being secured to said board by resin, said apparatus comprising:

(a) means for heating said resin so as at least partially to soften it, (b) means for monitoring said resin so as to determine the softening state thereof, and (c) means for removing said component from said board in response to said means for monitoring determining when said resin has at least partly softened, and wherein said means for monitoring said resin comprises means for applying a pre-load force to said component and means for sensing movement of said component relative to said board under the action of said pre-load force.

12. Apparatus for removing an electronic component from a wiring board, said component being connected to wiring on said board by wires, said apparatus comprising a chuck for holding said component during its removal from said board, said chuck having at least one cutting edge for cutting said wires.

13. Method of manufacture of an electronic apparatus comprising the steps of:

(a) securing at least one electronic component to a wiring board having wiring at its surface connected to said component in the secured position thereof, said component being secured to said board by means of heat-softenable resin, (b) testing said electronic component by means of signals applied via said wiring, (c) when said component is determined by said testing to be defective, removing said component from said board by heating said resin so as to soften it at least partially and detaching said component from said board when said resin is so softened, wherein softening of said resin is monitored by applying a pre-load force to said component and sensing movement of said component, (d) removing residual resin remaining on said board at the location of said component by means of ultraviolet beam radiation having at said surface of said board an energy density of the range 0.1 to 1 joule per pulse per $cm^2$, a peak power density of at least $10^6$ W per $cm^2$, and a wavelength of not more than 360 nm, and (e) securing a further electronic component to said board at the location of said removed component by means of heat-softenable resin.

* * * * *